United States Patent
Xu et al.

(10) Patent No.: US 10,326,031 B2
(45) Date of Patent: Jun. 18, 2019

(54) METHOD OF PATTERNING AN AMORPHOUS SEMICONDUCTOR LAYER

(71) Applicants: IMEC vzw, Leuven (BE); Katholieke Universiteit Leuven, Leuven (BE)

(72) Inventors: Menglei Xu, Heverlee (BE); Miha Filipic, Heverlee (BE); Twan Bearda, Mechelen (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 0 days.

(21) Appl. No.: 15/803,650

(22) Filed: Nov. 3, 2017

(65) Prior Publication Data
US 2018/0122963 A1  May 3, 2018

(30) Foreign Application Priority Data
Nov. 3, 2016  (EP) .................................... 16197123

(51) Int. Cl.
*H01L 31/0236* (2006.01)
*H01L 31/18* (2006.01)
(Continued)

(52) U.S. Cl.
CPC .. *H01L 31/02363* (2013.01); *H01L 21/32132* (2013.01); *H01L 21/32139* (2013.01);
(Continued)

(58) Field of Classification Search
CPC .......... H01L 21/76898; H01L 23/5227; H01L 28/10; H01L 21/768; H01L 23/49827;
(Continued)

(56) References Cited

U.S. PATENT DOCUMENTS

| 5,379,698 A | * | 1/1995 | Nowak | .................. B41C 1/1033 |
| | | | | 101/454 |
| 2002/0195435 A1 | * | 12/2002 | Nagarkar | ............ G02F 1/13439 |
| | | | | 219/121.73 |

(Continued)

OTHER PUBLICATIONS

Ring et al. ("Emitter Patterning for Back-Contacted Si Heterojunction Solar Cells Using Laser Written Mask Layers for Etching and Self-Aligned Passivation (LEAP)", IEEE Journal of Photovoltaics, vol. 6, No. 4, Jul. 2016).*

(Continued)

*Primary Examiner* — Brian Turner
(74) *Attorney, Agent, or Firm* — Knobbe Martens Olson & Bear LLP (57) ABSTRACT

Methods of patterning an amorphous semiconductor layer according to a predetermined pattern via laser ablation with a pulsed laser having a laser wavelength are disclosed. In one aspect, a method may include providing the amorphous semiconductor layer on a substrate, providing a distributed Bragg reflector on the amorphous semiconductor layer, wherein the distributed Bragg reflector is reflective at the laser wavelength, providing an absorbing layer on the distributed Bragg reflector, wherein the absorbing layer is absorptive at the laser wavelength, patterning the absorbing layer by laser ablation, in accordance with the predetermined pattern, patterning the distributed Bragg reflector by performing an etching step using the patterned absorbing layer as an etch mask, and etching the amorphous semiconductor layer using the patterned distributed Bragg reflector as an etch mask. Methods of fabricating silicon heterojunction back contact photovoltaic cell(s) using such amorphous semiconductor layer patterning process are also disclosed.

20 Claims, 8 Drawing Sheets

(51) Int. Cl.
*H01L 31/0747* (2012.01)
*H01L 33/46* (2010.01)
*H01L 33/32* (2010.01)
*H01L 31/054* (2014.01)
*H01L 21/3213* (2006.01)
*H01L 31/20* (2006.01)

(52) U.S. Cl.
CPC ...... H01L 31/0547 (2014.12); H01L 31/0747 (2013.01); H01L 31/1804 (2013.01); H01L 31/202 (2013.01); *Y02E 10/52* (2013.01); *Y02P 70/521* (2015.11)

(58) Field of Classification Search
CPC ........... H01L 23/49816; H01L 23/5389; H01L 25/0652; H01L 25/0657; H01L 25/50; H01L 25/16; H01L 23/49822; H01L 23/05
See application file for complete search history.

(56) References Cited

U.S. PATENT DOCUMENTS

2011/0299166 A1* 12/2011 Sun .......................... B32B 37/02
359/579
2013/0070212 A1* 3/2013 Hough ................... G03B 21/14
353/62
2015/0056744 A1 2/2015 Song et al.
2016/0284898 A1* 9/2016 Pei .................. H01L 31/022441

OTHER PUBLICATIONS

Xu et al., ("Laser Assisted Patterning of a-Si:H: Detailed Investigation of Laser Damage" Article in physica status solidi (RRL)—Rapid Research Letters • Jul. 2017 DOI: 10.1002/pssr.201700125).*
Desrues T. et al. "SLASH Concept: A Novel Approach for Simplified Interdigitated Back Contact Solar Cells Fabrication", Photovoltaic Specialists Conference (PVSC), 2012 38$^{th}$ IEEE, pp. 1602-1605, Jun. 2012; 4 pages.
Ring Sven et al., "Emitter Patterning for Back-Contacted Si Heterojunction Solar Cells Using Laser Written Mask Layers for Etching and Self-Aligned Passivation (LEAP)", IEEE Journal of Photovoltaics, vol. 6, No. 4, Jul. 2016; 6 pages.
Xu et al., "Damage-free laser ablation for emitter patterning of silicon heterojunction interdigitated back-contact solar cells", Doc. No. XP055460803 (retrieved on Mar. 18, 2019 from researchgate.net, doc # 318653801) , published on Jun. 1, 2017; 5 pages.
Extended European Search Report in European Application No. 17197010.6, dated Apr. 5, 2018; 7 pages.

* cited by examiner

METHOD OF PATTERNING AN AMORPHOUS SEMICONDUCTOR LAYER

CROSS-REFERENCE TO RELATED APPLICATIONS

This application claims foreign priority to European Patent Application No. EP 16197123.9, filed Nov. 3, 2016, which is incorporated herein by reference in its entirety.

BACKGROUND

Field

The disclosed technology relates to methods for patterning amorphous semiconductor layers, such as amorphous silicon layers.

Methods in accordance with the disclosed technology may be used for patterning amorphous silicon layers in a fabrication process of silicon heterojunction photovoltaic cells, such as silicon heterojunction interdigitated back contact cells.

The project leading to this application has received funding from the European Union's Horizon 2020 research and innovation programme under the Marie Sklodowska-Curie grant agreement No. 657270.

Description of the Related Technology

In a method for fabricating silicon heterojunction (SHJ) photovoltaic cells, a heterojunction may be formed by providing a thin doped hydrogenated amorphous silicon (a-Si:H) layer on a crystalline silicon substrate. A thin intrinsic hydrogenated amorphous silicon layer may be provided on the crystalline silicon substrate surface before providing the doped hydrogenated amorphous silicon layer, for good surface passivation. In a fabrication process of SHJ interdigitated back contact (SHJ-IBC) photovoltaic cells, there is a need for providing differently doped regions at the rear side. This means that at the rear side of the crystalline silicon substrate a patterned p-type a-Si:H layer and a patterned n-type a-Si:H layer are to be formed side by side. Typically first an a-Si:H layer of a first doping type is formed on the entire rear side and this layer is patterned by locally removing the layer according to a predetermined pattern. Afterwards an a-Si:H layer of a second, opposite, doping type is provided at locations where the first a-Si:H layer of the first doping type has been removed. This requires re-passivation of the crystalline silicon surface at those locations.

Photolithography may be used for patterning an a-Si:H layer, but this is not compatible with large-scale industrial production. As an alternative to photolithography laser ablation may be used. However, during the laser ablation process the crystalline silicon surface is damaged. The laser ablation process may induce defects, surface roughness and/or thermal damage to the silicon substrate, such that there is a need for performing a laser damage removal step after patterning of the a-Si:H layer and a good re-passivation of the crystalline silicon surface in the ablated regions may be problematic. Therefore, methods are being developed wherein laser ablation induced damage is reduced or substantially avoided.

In "SLASH Concept: A Novel Approach for Simplified Interdigitated Back Contact Solar Cells Fabrication", Proceedings of the 38th IEEE PVSC, 2012, pages 001602-001605, T. Desrues et al. propose a method wherein a PECVD (Plasma Enhanced Chemical Vapor Deposition) $SiN_x$:H layer is provided on top of an a-Si:H layer to be patterned. The PECVD $SiN_x$:H layer is first patterned by laser ablation, and next the underlying a-Si:H layer is patterned by wet chemical etching using the patterned $SiN_x$:H layer as a dielectric hard mask. By optimizing the deposition conditions of the $SiN_x$:H layer its absorption coefficient at the laser wavelength is increased/maximized, such that it absorbs a substantial part of the laser power and less laser power can reach the underlying a-Si:H layer and crystalline silicon substrate. This results in a reduction of laser damage to the a-Si:H layer and the crystalline silicon substrate as compared to a method wherein the a-Si:H layer is directly laser ablated. However, when using this method for forming a pattern comprising a continuous shape such as a line shape or a rectangular shape, as for example required in a process for fabricating SHJ-IBC cells, the pattern is formed by providing laser pulses in adjacent dot-shaped areas. In such a process, an overlap between two adjacent laser pulses or two adjacent dot-shaped areas cannot be avoided. This results in an increased laser power in the overlapping areas, reaching the underlying a-Si:H layer and crystalline substrate and inducing damage.

In "Emitter Patterning for Back-Contacted Si Heterojunction Solar Cells Using Laser Written Mask Layers for Etching and Self-Aligned Passivation (LEAP)", IEEE Journal of Photovoltaics, Vol. 6, No. 4, July 2016, pages 894-899, Sven Ring et al. describe a process that allows reducing or substantially avoiding laser damage to the substrate in areas of overlapping laser pulses. This method comprises: depositing, on top of a crystalline substrate with an a-Si emitter layer to be patterned, a $SiO_2$/a-Si:H/$SiO_2$/a-Si:H layer stack; patterning the upper a-Si:H layer by laser ablation; patterning the underlying $SiO_2$ and a-Si:H layers by wet etching in HF and KOH respectively using the laser ablated a-Si:H layer as an etch mask; opening the underlying $SiO_2$ layer using wet etching in HF with the lower a-Si:H interlayer acting as an etch mask; and finally etching the a-Si emitter layer in an alkaline etchant. It is shown that the lower a-Si:H interlayer of the $SiO_2$/a-Si:H/$SiO_2$/a-Si:H layer stack may protect the substrate from laser damage during laser ablation of the upper a-Si:H layer of the stack. It is a disadvantage of this approach that patterning of the $SiO_2$ and a-Si:H layers underlying the upper a-Si:H layer, after laser ablation of the upper a-Si:H layer, requires different etchants for the different layers, e.g. an HF based etchant for patterning the $SiO_2$ layers and an alkaline etchant for patterning the lower a-Si:H layer.

SUMMARY OF CERTAIN INVENTIVE ASPECTS

One objective of the disclosed technology is to provide methods for laser ablation based patterning of amorphous silicon layers wherein damage to an underlying substrate, e.g., a crystalline silicon substrate, is substantially reduced.

Another objective of the disclosed technology is to provide methods for fabricating silicon heterojunction photovoltaic cells, such as silicon heterojunction interdigitated back contact cells, e.g., wherein an amorphous silicon layer is patterned by a laser ablation based process and wherein damage to the silicon substrate is substantially reduced.

The above objectives are accomplished by methods according to embodiments of the disclosed technology.

In a first aspect, the disclosed technology relates to a method for patterning an amorphous semiconductor, such as an amorphous silicon layer, according to a predetermined pattern by means of laser ablation.

In a second aspect, the disclosed technology relates to a method for fabricating silicon heterojunction back contact photovoltaic cells, such as silicon heterojunction interdigitated back contact photovoltaic cells, wherein emitter regions or back surface field regions are patterned in accordance with an embodiment of the first aspect.

A method for patterning an amorphous semiconductor layer according to a predetermined pattern by means of laser ablation with a pulsed laser having a laser wavelength in accordance with the first aspect of the disclosed technology may comprise providing the amorphous semiconductor layer on a substrate, providing a distributed Bragg reflector on the amorphous semiconductor layer, wherein the distributed Bragg reflector is reflective at the laser wavelength, providing an absorbing layer on the distributed Bragg reflector, wherein the absorbing layer is absorptive at the laser wavelength, patterning the absorbing layer by laser ablation with the pulsed laser, in accordance with the predetermined pattern, thereby obtaining a patterned absorbing layer, patterning the distributed Bragg reflector by performing an etching step using the patterned absorbing layer as an etch mask, thereby obtaining a patterned distributed Bragg reflector, and etching the amorphous semiconductor layer using the patterned distributed Bragg reflector as an etch mask, thereby patterning the amorphous semiconductor layer according to the predetermined pattern.

Accordingly, the amorphous semiconductor layer may be formed on the substrate. The amorphous semiconductor layer may be formed on the substrate using any suitable method as is known in the art. Further, the distributed Bragg reflector may be formed on the amorphous semiconductor layer. The distributed Bragg reflector may be formed using any suitable method as is known in the art. As such, the absorbing layer may be formed on the distributed Bragg reflector. The absorbing layer may be formed using any suitable method as is known in the art.

According to the disclosed technology, the absorbing layer may be patterned by laser ablation with the pulsed laser. The absorbing layer may be patterned according to a predetermined pattern, thereby obtaining a patterned absorbing layer. Accordingly, the distributed Bragg reflector is patterned by etching, using the patterned absorbing layer as an etch mask. The predetermined pattern is thereby transferred to the distributed Bragg reflector resulting in that a patterned distributed Bragg reflector is achieved. Further, the amorphous semiconductor layer may be patterned by etching using the patterned distributed Bragg reflector as an etch mask. The predetermined pattern is thereby transferred to the amorphous semiconductor layer resulting in that a patterned amorphous semiconductor layer is achieved. As such, the patterned amorphous semiconductor layer is patterned according to the predetermined pattern. Hence, the predetermined pattern is accordingly transferred from the absorbing layer to the distributed Bragg reflector and subsequently from the distributed Bragg reflector to the amorphous semiconductor layer.

The amorphous semiconductor layer may be an amorphous silicon layer or an amorphous silicon germanium layer. The amorphous semiconductor layer may be a single layer or a stack comprising at least two layers, such as for example a stack comprising an intrinsic (non-doped) amorphous semiconductor layer and a doped amorphous semiconductor layer.

The method for patterning an amorphous semiconductor layer according to embodiments of the disclosed technology may further comprise removing the patterned distributed Bragg reflector.

The distributed Bragg reflector may have a reflectance higher than 70%, preferably higher than 80%, at the laser wavelength. The distributed Bragg reflector may comprise a stack of alternating layers. In one implementation, for example, the distributed Bragg reflector may comprise a stack of alternating layers of a first material having a first refractive index and a second material having a second refractive index different from the first refractive index. The first and second materials may be dielectric materials or semiconductor materials. The distributed Bragg reflector may comprise a stack of alternating dielectric layers, the stack comprising at least one sub-stack including a silicon oxide layer and a silicon nitride layer. The distributed Bragg reflector may comprise a stack of alternating dielectric layers, wherein the stack may comprise 1 to 10 sub-stacks, each sub-stack including a silicon oxide layer and a silicon nitride layer.

The absorbing layer may have an absorptance higher than 90% at the laser wavelength. In embodiments of the disclosed technology, the absorbing layer may be an amorphous silicon layer.

A method for fabricating a silicon heterojunction back contact photovoltaic cell according to the second aspect of the disclosed technology may comprise depositing on a surface of a doped crystalline silicon substrate a first doped amorphous silicon layer of a first doping type, patterning the first doped amorphous silicon layer according to a predetermined pattern using a method according to an embodiment of the first aspect of the disclosed technology.

The method according to the second aspect may further comprise, after the step of patterning the first doped amorphous silicon layer, depositing a second doped amorphous silicon layer at a same surface of the crystalline silicon substrate, the second doped amorphous silicon layer having a second doping type opposite to the first doping type. Depositing the second doped amorphous silicon layer may be done before removing the patterned distributed Bragg reflector.

The first doped amorphous silicon layer may have a first doping type opposite to a doping type of the crystalline silicon substrate and the predetermined pattern formed in the first doped amorphous silicon layer may correspond to an emitter pattern of the back-contact heterojunction silicon photovoltaic cell. In this case the second doped amorphous silicon layer may have a second doping type equal to the doping type of the crystalline silicon substrate and the second doped amorphous silicon layer may form back surface field regions of the back-contact heterojunction silicon photovoltaic cell.

In another embodiment, the first doped amorphous silicon layer may have a first doping type equal to a doping type of the crystalline silicon substrate and the predetermined pattern formed in the first doped amorphous silicon layer may correspond to a back-surface field pattern of the back contact heterojunction silicon photovoltaic cell. In this case, the second doped amorphous silicon layer may have a second doping type opposite to the doping type of the crystalline silicon substrate and the second doped amorphous silicon layer may form emitter regions of the back-contact heterojunction silicon photovoltaic cell.

One advantage of methods of the disclosed technology is that they allow at least reducing laser damage to the underlying substrate without the need for optimization of dielectric deposition conditions, e.g., as compared to the SLASH approach described above.

Another advantage of methods of the disclosed technology is that there is no need for a performing a laser damage removal step after patterning of the amorphous silicon layer.

Yet another advantage of methods of the disclosed technology is that patterning the distributed Bragg reflector and afterwards removing the patterned distributed Bragg reflector may be done using a single etchant for the different layers forming the distributed Bragg reflector.

Still another advantage of methods of the disclosed technology is that the methods are compatible with industrial fabrication processes and large-scale, high-throughput production.

Some particular and advantageous aspects of the disclosure are set out in the accompanying independent and dependent claims. Features from the dependent claims may be combined with features of the independent claims and with features of other dependent claims as appropriate and not merely as explicitly set out in the claims.

The above and other characteristics, features and advantages of the disclosed technology will become apparent from the following detailed description, taken in conjunction with the accompanying drawings, which illustrate, by way of example, various aspects and/or principles of the disclosure. This description is given for the sake of example only, without limiting the scope of the disclosure. The reference figures quoted below refer to the attached drawings.

BRIEF DESCRIPTION OF THE DRAWINGS

In the different drawings, the same reference signs refer to the same or analogous elements.

DETAILED DESCRIPTION OF CERTAIN EMBODIMENTS

The disclosed technology will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

The terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the disclosed technology, the only relevant components of the device are A and B.

Reference throughout this specification to "one embodiment" or "an embodiment" means that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The following terms are provided solely to aid in the understanding of the disclosure.

In the context of the disclosed technology, the front surface or front side of a photovoltaic cell or of a photovoltaic module is the surface or side adapted for being oriented towards a light source and thus for receiving illumination. In case of bifacial photovoltaic cells or modules, both surfaces are adapted to receive impinging light. In such case, the front surface or front side is the surface or side adapted for receiving the largest fraction of the light or illumination. The back surface, rear surface, back side or rear side of a photovoltaic cell or a photovoltaic module is the surface or side opposite to the front surface or side.

The disclosure will now be described by a detailed description of several embodiments of the disclosure. It is clear that other embodiments of the disclosure can be configured according to the knowledge of persons skilled in the art without departing from the technical teaching of the disclosure, the disclosure being limited only by the terms of the appended claims.

In the further description, methods according to the disclosed technology are described wherein the layer to be patterned is an amorphous silicon layer. However, the disclosed technology is not limited thereto. Methods according to the disclosed technology may also be used for patterning other amorphous semiconductor layers, such as e.g. amorphous SiGe layers. Methods according to the disclosed technology may be used for patterning amorphous, polycrystalline or crystalline layers, wherein the layers may be electrically conductive layers (such as metal layers or conductive oxide layers, e.g. Indium Tin Oxide (ITO) layers), semiconducting layers (such as Si layers or SiGe layers) or electrically insulating layers, e.g. dielectric layers.

In a first aspect, the disclosed technology provides methods for patterning amorphous semiconductor layers, such as amorphous silicon layers, according to a predetermined pattern, by means of a laser ablation based process wherein damage to an underlying substrate, such as for example a crystalline silicon substrate, is at least reduced. According to the disclosed technology, laser ablation may be done by means of a pulsed laser, the laser having a laser wavelength.

Figure 1:
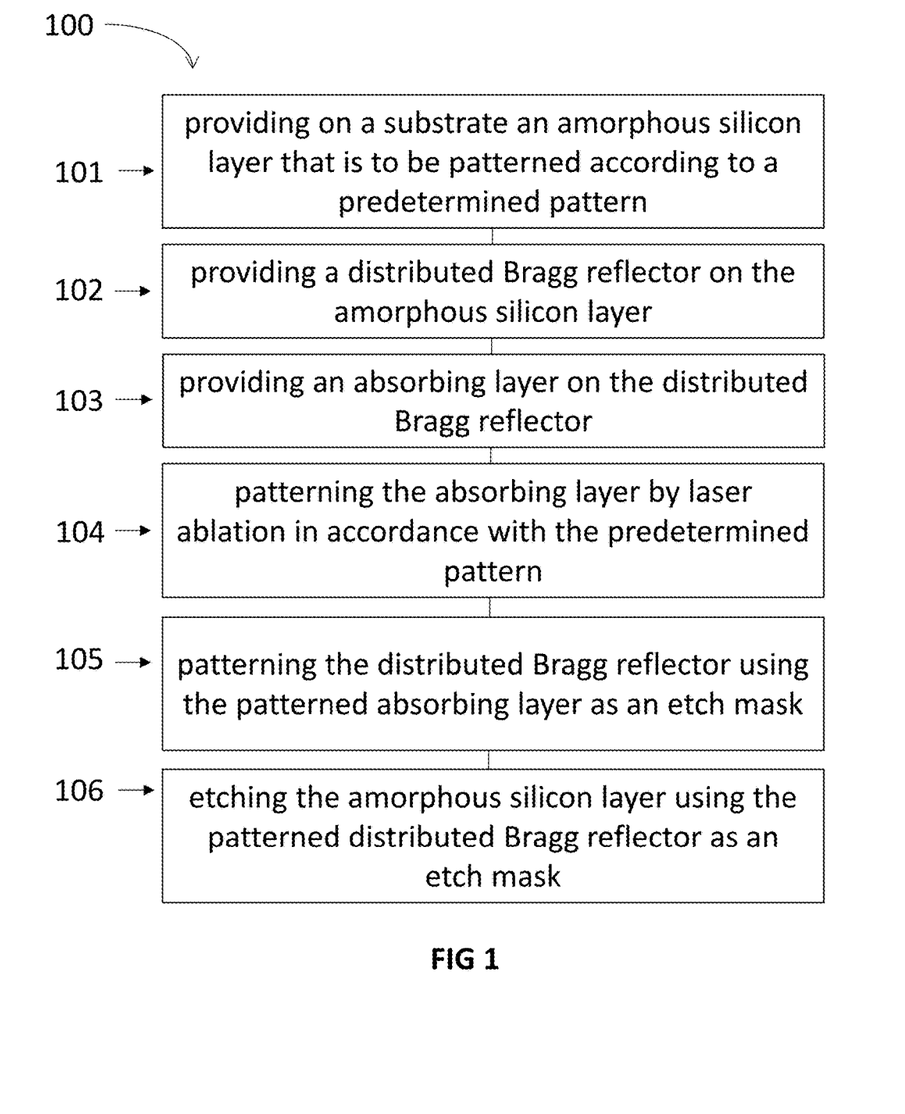
FIG. 1 schematically illustrates a flow chart of a method for patterning an amorphous silicon layer according to an embodiment of the first aspect of the disclosed technology.

A method 100 for patterning an amorphous semiconductor layer according to an embodiment of the first aspect of the disclosed technology is schematically illustrated in FIG. 1 (flow chart) and in FIG. 2 to FIG. 7 (cross sections), wherein the amorphous semiconductor layer is an amorphous silicon layer.

Figure 2:
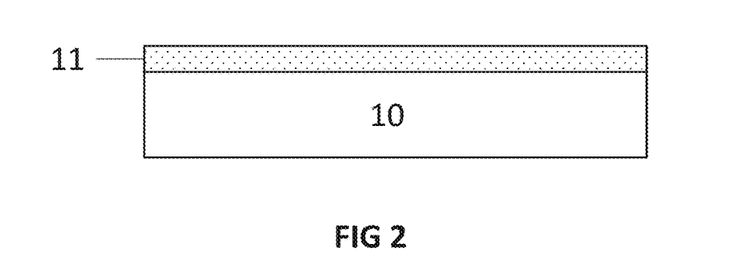
FIG. 2 to FIG. 7 schematically illustrate process steps of a method for patterning an amorphous silicon layer according to an embodiment of the first aspect of the disclosed technology.
Figure 3:
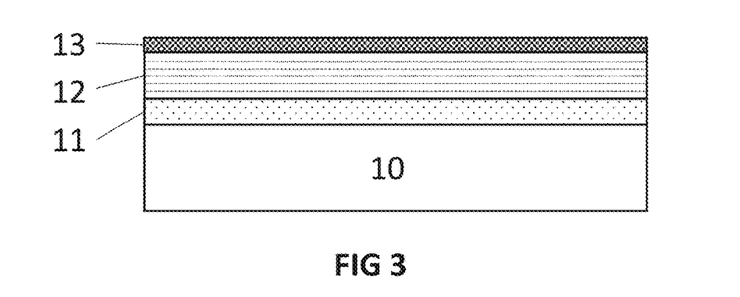

As illustrated in FIG. 1 and FIG. 2, in a first step 101 of the method 100 the amorphous silicon layer 11 to be patterned according to a predetermined pattern is provided on a substrate 10. Accordingly, the amorphous silicon layer 11 to be patterned is formed. The substrate may be a semiconductor substrate such as a silicon substrate, for example a crystalline silicon substrate. However, the disclosed technology is not limited thereto and other substrates may be used, such as glass substrates. The amorphous silicon layer 11 may be a single layer, for example an intrinsic amorphous silicon layer or a doped amorphous silicon layer. The amorphous silicon layer 11 may be a layer stack comprising at least two layers, such as a stack comprising an intrinsic amorphous silicon layer and a doped amorphous silicon layer.

Next, (FIG. 1 step 102, schematically illustrated in FIG. 3) a distributed Bragg reflector 12 is provided on the amorphous silicon layer 11. Accordingly, a distributed Bragg reflector 12 is formed. The illustrated distributed Bragg reflector 12 comprises a stack of alternating layers of different materials with different refractive indices, i.e., it comprises a stack of alternating layers of a first material having a first refractive index and a second material having a second refractive index different from the first refractive index. The distributed Bragg reflector 12 may comprise a stack of alternating dielectric layers. The stack of alternating dielectric layers may comprise at least one sub-stack consisting of a silicon oxide layer and a silicon nitride layer. The stack of alternating dielectric layers may comprise 1 to 10 sub-stacks, each sub-stack consisting of a silicon oxide layer and a silicon nitride layer, for example 5 to 8 sub-stacks. Other materials may be used for forming the distributed Bragg reflector 12, such as other dielectric materials or semiconductor materials. Preferably the different materials have a large difference in refractive index and can easily be etched using a same etchant, preferably under similar etching conditions for both materials, wherein the etchant is selective to (i.e. is substantially not etching) the material of the absorbing layer as further described. In view of avoiding laser induced thermal damage, the materials preferably have a low thermal conductivity.

The thickness of the alternating layers of the distributed Bragg reflector 12 may be optimized to obtain a desired reflection, e.g., maximum reflection, at the wavelength of the laser that is used in a further process step of a method 100 of the disclosed technology. The thickness of the layers may be selected so as to obtain a reflectance higher than 70%, or in some aspects higher than 80% at the laser wavelength. Optimization of the layer thicknesses may be done based on optical simulations, taking into account the refractive index of the layers at the laser wavelength. Typically the optical thickness (i.e., the product of the refractive index at the laser wavelength and the physical thickness) of the layers is in the order of a quarter of the laser wavelength.

In a next process step 103 (FIG. 1, illustrated in FIG. 3) an absorbing layer 13 is provided on the distributed Bragg reflector 12. Accordingly, an absorbing layer 13 is formed. The absorbing layer 13 is a layer that substantially absorbs light at the laser wavelength. The material and the thickness of the absorbing layer 13 may be selected to absorb more than 80%, or in some aspects more than 90% of the laser light. Further, the material of the absorbing layer may advantageously be selected to have a high etching selectivity with respect to the material of the distributed Bragg reflector. The absorbing layer 13 may comprise or consist of an amorphous silicon layer. However, other materials may be used for the absorbing layer. The absorbing layer may comprise or consist of a crystalline silicon layer or a polymer layer. The absorbing layer may be an intrinsic (non-doped) layer or a doped layer.

Figure 4:
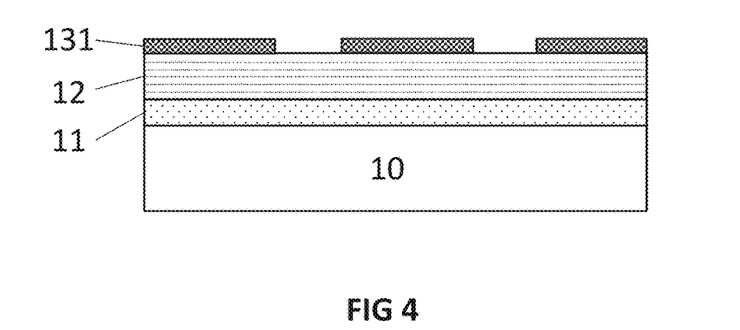

At step 104 (FIG. 1) of the method 100 the absorbing layer 13 is patterned by laser ablation according to a predetermined pattern, such that a patterned absorbing layer 131 is obtained, as schematically illustrated in FIG. 4. in some aspects, patterning of the absorbing layer 13 may be done using a pulsed laser. A laser having a laser wavelength of 355 nm may be used. A laser energy fluence in the range between 0.17 J/cm$^2$ and 1.01 J/cm$^2$, such as a laser fluence of about 0.2 J/cm$^2$ may advantageously be used.

As one alternative to a laser wavelength of 355 nm, a green laser having a laser wavelength of 532 nm may be used.

One advantage of the method 100 that the distributed Bragg reflector 12 provides a desired reflection of the laser light used for patterning the absorber layer 13. This counteracts that the laser light reaches the underlying amorphous silicon layer 11 and silicon substrate 10, such that laser induced damage to these underlying layers may be reduced.

Figure 5:
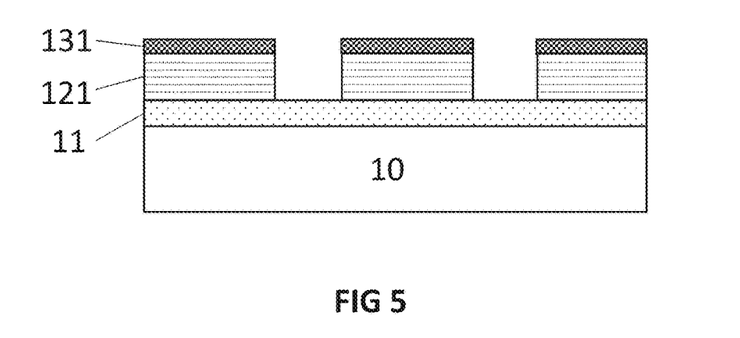

A next step of the method 100 comprises patterning (FIG. 1, step 105) the distributed Bragg reflector 12 by performing an etching step, using the patterned absorbing layer 131 as an etch mask. When the distributed Bragg reflector 12 comprises alternating silicon oxide and silicon nitride layers, etching of the reflector 12 may comprise wet etching in diluted $HF:HCl:H_2O$, 1:1:20. Other wet etchants or a dry etching process may be used, such as a $CHF_3$ plasma etching process. This etching step 105 results in a patterned distributed Bragg reflector 121, as illustrated in FIG. 5. Accordingly, the predetermined pattern is thereby transferred to the distributed Bragg reflector 12 resulting in that a patterned distributed Bragg reflector 121 is achieved.

Figure 6:
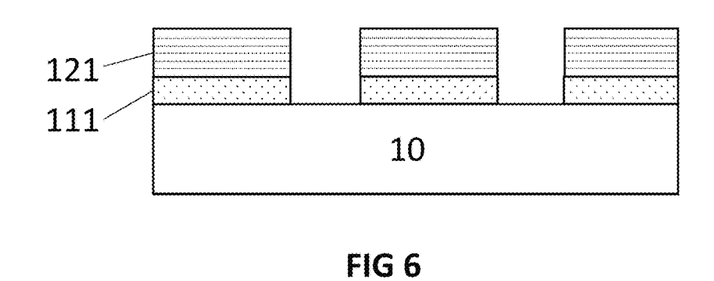
Figure 7:
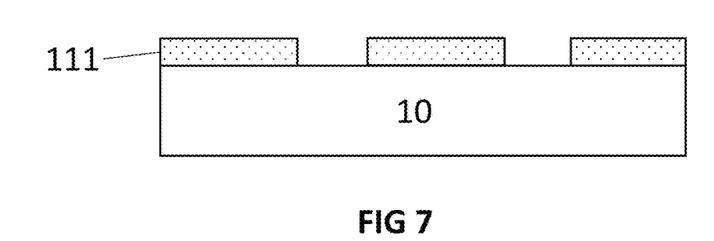

The amorphous silicon layer 11 is then etched (FIG. 1, step 106) using the patterned distributed Bragg reflector 121 as an etch mask. In embodiments wherein the absorbing layer 13 is an amorphous silicon layer, this layer is at least partially removed during etching step 106. This is schematically illustrated in FIG. 6 (assuming full removal of the absorbing layer in this example). Hence, in FIG. 6, the absorbing layer 13 is depicted as being completely removed. Etching of the amorphous silicon layer 11 may comprise dry etching, such as etching with a $NF_3$/Ar plasma, or wet etching, such as etching in 1% TMAH (Tetramethylammonium hydroxide) at ambient temperature. This etching step 106 results in a patterned amorphous silicon layer 111 according to the predetermined pattern (FIG. 6). Hence, the predetermined pattern is accordingly transferred from the absorbing layer 13 to the distributed Bragg reflector 12 and subsequently from the distributed Bragg reflector 12 to the amorphous semiconductor layer 11.

In a next step (FIG. 7) the patterned distributed Bragg reflector 121 may be removed, for example by wet etching in diluted $HF:HCl:H_2O$, 1:1:20.

Experiments were done wherein test structures were fabricated, in order to perform reflection measurements.

Figure 8:
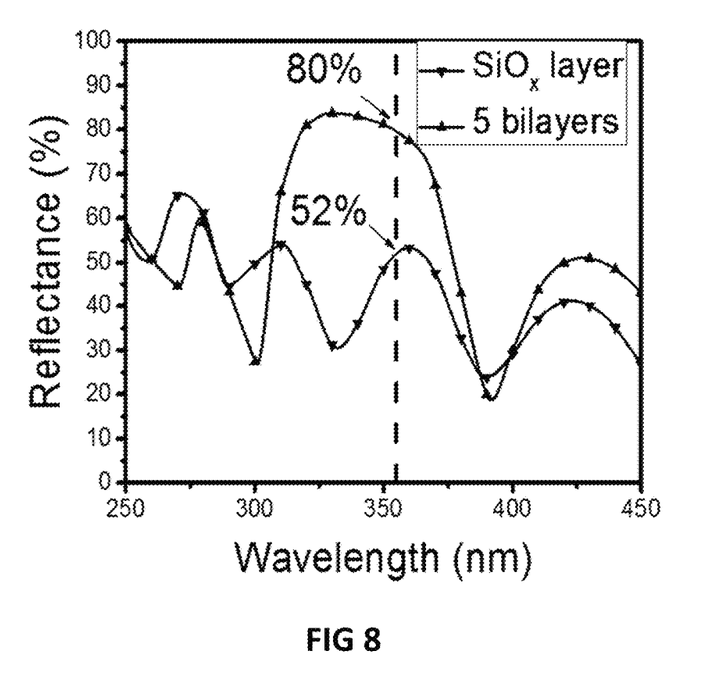
FIG. 8 shows the measured reflectance as a function of wavelength for a test structure consisting of a silicon substrate covered with a silicon oxide layer (downward triangles) and for a test structure consisting of a silicon substrate covered with a dielectric distributed Bragg reflector composed of 5 sub-stacks each consisting of a silicon oxide layer and a silicon nitride layer (upward triangles).

As a reference, a structure consisting of a single silicon oxide layer on a chemically polished silicon substrate was used. A 630 nm thick silicon oxide layer was deposited on an n-type crystalline silicon substrate by means of PECVD (Plasma Enhanced Chemical Vapour Deposition). Deposition was done at 225° C. and 1.0 Torr (133.3 Pa), with $N_2O$ (500 sccm) and $SiH_4$ (5 sccm) as precursors. At 355 nm wavelength (corresponding to a laser wavelength that may be used according to one or more aspects of the disclosed technology) a silicon oxide refractive index of 1.48 was measured. FIG. 8 shows the measured reflectance as a function of wavelength in the range between 250 nm and 450 nm for this reference test structure (downward triangles). At 355 nm wavelength a reflectance of 52% was measured.

Test structures were fabricated wherein a dielectric distributed Bragg reflector was deposited on a chemically polished silicon substrate. On an n-type crystalline silicon substrate a layer stack consisting of alternating silicon oxide and silicon nitride layers was deposited. The layer stack consisted of five sub-stacks, each sub-stack consisting of a silicon oxide layer and a silicon nitride layer. The silicon oxide layers were deposited by means of PECVD (Plasma Enhanced Chemical Vapour Deposition). Deposition was done at 225° C. and 1.0 Torr (133.3 Pa), with $N_2O$ (500 sccm) and $SiH_4$ (5 sccm) as precursors. The physical thickness of these silicon oxide layers was about 60 nm. The refractive index measured at 355 nm wavelength (corresponding to a laser wavelength that may be used in one or more embodiments of the disclosed technology) was 1.48. The optical thickness (refractive index times physical thickness) was thus substantially equal to a quarter of the laser wavelength. Silicon nitride layers were deposited in the same PECVD reactor at the same temperature of 225° C. and at 1.2 Torr (160 Pa), using $NH_3$ (50 sccm), $N_2$ (1000 sccm), $SiH_4$ (10 sccm) as precursors. The physical thickness of these silicon nitride layers was about 48 nm. The refractive index measured at 355 nm wavelength was 1.83. The optical thickness (refractive index times physical thickness) was thus substantially equal to a quarter of the laser wavelength. FIG. 8 shows the measured reflectance as a function of wavelength in the range between 250 nm and 450 nm for this test structure (upward triangles). At 355 nm wavelength a reflectance of 80% was measured, which is substantially higher than the 52% reflectance measured at the same wavelength on the reference structure.

An advantage of having a high reflection, e.g., a reflectance higher than 70%, or in some aspects higher than 80%, at the laser wavelength that it may substantially reduce laser induced damage to the silicon substrate, as may result from a laser ablation process. The higher the reflectance at the laser wavelength, the less laser damage may be induced in the underlying layers and substrate.

Further reflection measurements were performed on silicon substrates having a dielectric distributed Bragg reflector, with more than five sub-stacks (up to ten sub-stacks), each sub-stack consisting of a silicon oxide layer and a silicon nitride layer as described above. It was experimentally found that for a reflector containing ten sub-stacks the reflectance is not significantly higher than for a reflector containing less than ten sub-stacks. This may be related to surface roughness, which was observed to increase with an increasing number of layers of the distributed Bragg reflector, the increased surface roughness leading to increased light scattering.

Further experiments were done wherein test structures were fabricated in accordance with the disclosed technology. Using these test structures, laser ablation tests were done and the resulting laser damage to the crystalline silicon substrate underlying the patterned amorphous silicon layer was investigated. In addition, surface passivation quality was assessed, more in particular the surface passivation quality of the crystalline silicon substrate in areas where the amorphous silicon layer had been removed using a method in accordance with an embodiment of the disclosed technology, these areas (further also referred to as 'laser opened areas' or 'laser ablated areas') being afterwards re-passivated by providing a further amorphous silicon layer.

Figure 9:
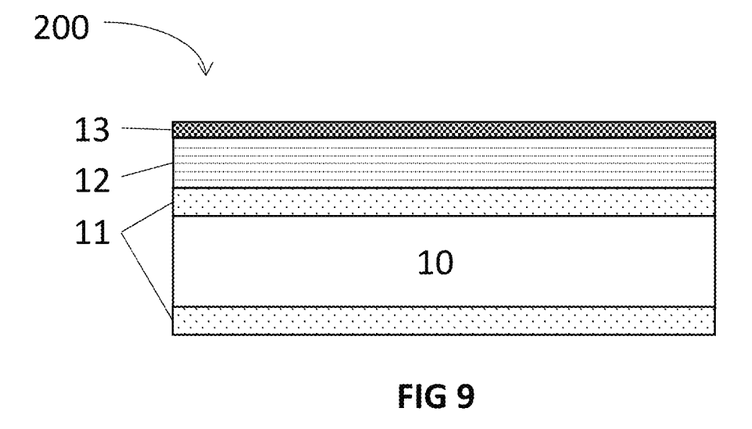
FIG. 9 schematically shows a cross section of a test structure used for laser ablation tests and for surface passivation tests.

FIG. 9 schematically shows a cross section of a test structure 200 used for these laser ablation tests and surface passivation tests. The test structure 200 comprises a crystalline silicon substrate 10, with an amorphous silicon layer 11 on both substrate surfaces. At a first side of the substrate (the side of the substrate comprising the amorphous silicon layer to be patterned), a dielectric distributed Bragg reflector 12 is provided on the amorphous silicon layer 11. On top of the distributed Bragg reflector 12 an absorbing layer 13 is present. As a reference, a similar test structure was used, but comprising a single silicon oxide layer instead of the dielectric distributed Bragg reflector.

On an n-type crystalline silicon substrate 10, first the amorphous silicon layers 11 were deposited by means of PECVD. Deposition was done by PECVD at a temperature of 175° C. and a pressure of 2.3 mbar (230 Pa). The amorphous silicon layer 11 consisted of an 5 nm thick intrinsic a-Si:H layer deposited on the substrate surface and a 27 nm thick n$^+$-type doped a-Si:H layer deposited on the intrinsic a-Si:H layer. For the intrinsic a-Si:H layer H$_2$ (640 sccm) and SiH$_4$ (160 sccm) were used as precursors; for the n$^+$-type doped a-Si:H layer H$_2$ (500 sccm), SiH$_4$ (50 sccm) and PH$_3$/H$_2$ (100 sccm) were used as precursors.

On the first side of the structure, a layer stack 12 consisting of alternating silicon oxide and silicon nitride layers was deposited on the amorphous silicon layer 11 (to be patterned). The layer stack consisted of five sub-stacks, each sub-stack consisting of a silicon oxide layer and a silicon nitride layer. The silicon oxide layers were deposited by means of PECVD (Plasma Enhanced Chemical Vapour Deposition). Deposition was done at 225° C. and 1.0 Torr (133.3 Pa), with N$_2$O (500 sccm) and SiH$_4$ (5 sccm) as precursors. The thickness of these silicon oxide layers was about 60 nm. Silicon nitride layers were deposited in the same PECVD reactor at the same temperature of 225° C. and at 1.2 Torr (160 Pa), using NH$_3$ (50 sccm), N$_2$ (1000 sccm), SiH$_4$ (10 sccm) as precursors. The thickness of these silicon nitride layers was about 48 nm. The total thickness of the layer stack was about 540 nm.

For the reference test structures, instead of depositing a layer stack with alternating silicon oxide and silicon nitride layers, a single 630 nm thick silicon oxide layer was deposited by PECVD on the amorphous silicon layer 11 to be patterned. Deposition of the PECVD silicon oxide layer was done at 225° C. and 1.0 Torr (133.3 Pa), with N$_2$O (500 sccm) and SiH$_4$ (5 sccm) as precursors. At a wavelength of 355 nm a refractive index of 1.48 was measured for this silicon oxide layer.

Finally, an absorbing layer 13 consisting of a 40 nm thick a-Si:H layer was deposited on the dielectric distributed Bragg reflector 12. For the reference test structure the absorbing layer 13 was deposited on the single silicon oxide layer. The absorbing layer was deposited by PECVD at 225° C. and 1 Torr (133.3 Pa), using H$_2$ (200 sccm) and SiH$_4$ (50 sccm) as precursors.

Using these test structures, laser ablation of the absorbing layer 13 was done using a 355 nm pulsed laser at a laser energy fluence of 0.2 J/cm$^2$, thereby completely removing the absorbing layer 13 in predetermined areas having a square shape and obtaining a patterned absorbing layer. Pulse duration was 12 ps, with a repetition frequency of 200 kHz. Within each square about 2000 parallel laser lines (each having a width of about 7 micrometer) were used, with a distance d between the centres of neighbouring lines. The risk of laser damage to the underlying substrate is highest in areas receiving two or more laser pulses, i.e. in overlapping areas between neighbouring laser dots within each line and in overlapping areas between neighbouring lines. For different squares, different distances d in the range between 6 micrometer and 12 micrometer were used.

After laser ablation of the absorbing layer, the distributed Bragg reflector and the single silicon oxide layer respectively were locally removed (patterned) by wet etching in a HF:HCl:H$_2$O (1:1:20) solution, using the patterned absorbing layer 13 as an etch mask. The underlying i/n$^+$ a-Si:H layer 11 was then etched using a 1% TMAH etching solution at ambient temperature for 8 minutes, using the patterned distributed Bragg reflector as an etch mask. As a result of this TMAH etching, the part of the absorbing layer 13 that had not been removed by the laser ablation process was etched too and completely removed.

Next a 1:1:20 HF dip was done for 1 minute, followed by deposition of an i/n$^+$ a-Si:H layer stack (for re-passivation of the ablated areas), using the same process conditions as for layer 11 described above.

In order to assess laser damage to the silicon substrate 10 in the laser opened (laser ablated) areas, surface SEM and AFM measurements were performed on these test structures. For the reference test structures having a single silicon oxide layer, SEM pictures clearly show the presence of laser induced damage and defects on the silicon substrate surface. The amount of laser damage was found to decrease with increasing distance between laser lines (12 micrometer distance versus 8 micrometer distance). On the test structures having a distributed Bragg reflector in accordance with an embodiment of the disclosed technology (12 micrometer distance between laser lines) substantially less laser induced damage was observed. 3D AFM images show a very rough silicon substrate surface with traces of laser lines for the reference test structures, and a very smooth surface with very limited traces of laser lines for the test structures having a distributed Bragg reflector. This illustrates that a method in accordance with embodiments of the disclosed technology may lead to strongly reduced laser damage and surface roughness of the silicon substrate.

Passivation tests were done on the test structures in the laser ablated areas, after deposition of the final i/n$^+$ a-Si:H layer stack as described above. From an analysis based on Photoluminescence Imaging, it was observed that for test structures having a distributed Bragg reflector according to embodiments of the disclosed technology, a large minority carrier lifetime (indicating a good passivation quality) was obtained in the laser opened areas, with a passivation quality similar to the passivation quality in the non-opened areas. This indicates that laser induced damage is avoided or substantially reduced in embodiments of the disclosed technology. For the reference test structure with a single 630 nm thick silicon oxide layer instead of a distributed Bragg reflector, the passivation quality in the laser opened areas was found to be lower than in the non-opened areas. Comparing the test structures fabricated according to an embodiment of the disclosed technology with the reference test structure, a significant improvement of the passivation quality in laser opened areas was observed.

Further, silicon heterojunction interdigitated back-contact (SHJ-IBC) solar cells with an active area of 3.97 cm$^2$ were fabricated using a distributed Bragg reflector, a laser-absorbing layer and laser ablation in accordance with the disclosed technology. The fabricated solar cells were tested and several parameters measured. A best efficiency of 21.8% and an average efficiency of 21.4% was achieved by the fabricated solar cells. Furthermore, open-circuit voltage V$_{OC}$ of the solar cell having the highest efficiency was measured to 724 mV and the average V$_{OC}$ was measured to 723 mV. The measured V$_{OC}$ is similar to that of previously reported solar cells where photolithographic methods have been used for patterning instead of using a distributed Bragg reflector for reducing damage by laser ablation. These results consequently indicate that laser damage has been reduced or potentially even avoided by employing the method of the disclosed technology.

A method for patterning an amorphous silicon layer in accordance with embodiments of the first aspect of the disclosed technology may advantageously be used in a fabrication process of silicon heterojunction back contact photovoltaic cells, such as silicon heterojunction interdigitated back contact photovoltaic cells.

In a second aspect, the disclosed technology relates to a method for fabricating silicon heterojunction back contact photovoltaic cells, wherein patterning of a doped amorphous silicon layer forming a heterojunction with the crystalline silicon substrate is done according to a method of the first aspect of the disclosed technology.

Figure 10:
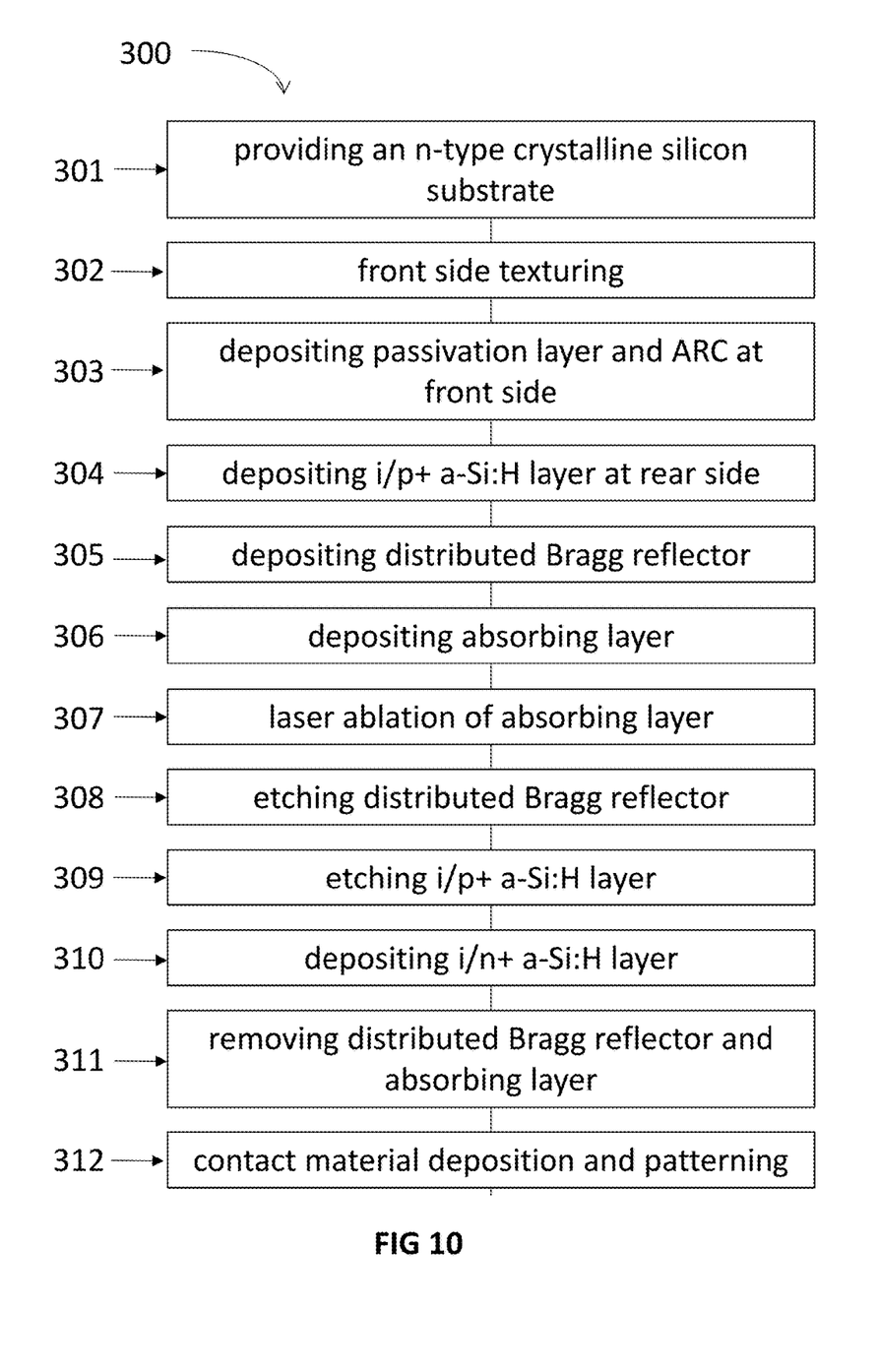
FIG. 10 schematically illustrates a process flow for fabricating a silicon heterojunction back contact photovoltaic cell in accordance with an embodiment of the second aspect of the disclosed technology.

A process flow of a method 300 for fabricating a silicon heterojunction back contact photovoltaic cell 400 in accordance with an embodiment of the second aspect of the disclosed technology is schematically illustrated in FIG. 10 (flow chart) and in FIG. 11 to FIG. 19 (cross sections, illustrating some of the process steps).

Figure 11:
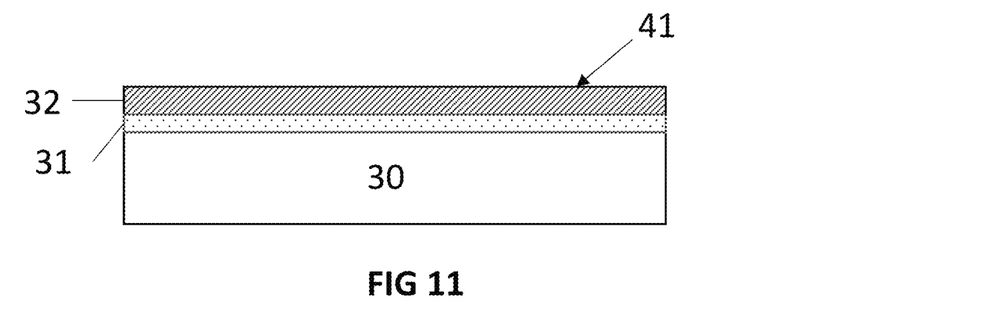
FIG. 11 to FIG. 19 schematically illustrate process steps of a method for fabricating silicon heterojunction back contact photovoltaic cells according to an embodiment of the second aspect of the disclosed technology.

In the method 300 shown in FIG. 10, an n-type crystalline silicon substrate is first provided (step 301). Instead of providing an n-type crystalline silicon substrate, a p-type silicon substrate may be used. The front side of the substrate 30 is then textured (FIG. 10, step 302) using known methods, e.g., based on wet anisotropic etching using for example a KOH or NaOH based etching solution or a TMAH based etching solution, or based on dry etching such as plasma etching. After texturing, a passivation layer 31 is provided on the front surface and an antireflection coating 32 is deposited (FIG. 10, step 303). An amorphous silicon (a-Si:H) passivation layer may be provided, e.g. having a thickness in the range between 3 nm and 15 nm, for example by Plasma Enhanced Chemical Vapor Deposition (PECVD) and a silicon nitride antireflection coating may be deposited on the a-Si:H passivation layer. However, other passivation layers and/or other antireflection coatings may be provided. FIG. 11 schematically illustrates a cross section of a structure obtained at this stage of the process, the structure comprising a silicon substrate 30, with at its front side 41 a passivation layer 31 and an antireflection coating 32. For ease of presentation, the front side texturing is not shown.

Figure 12:
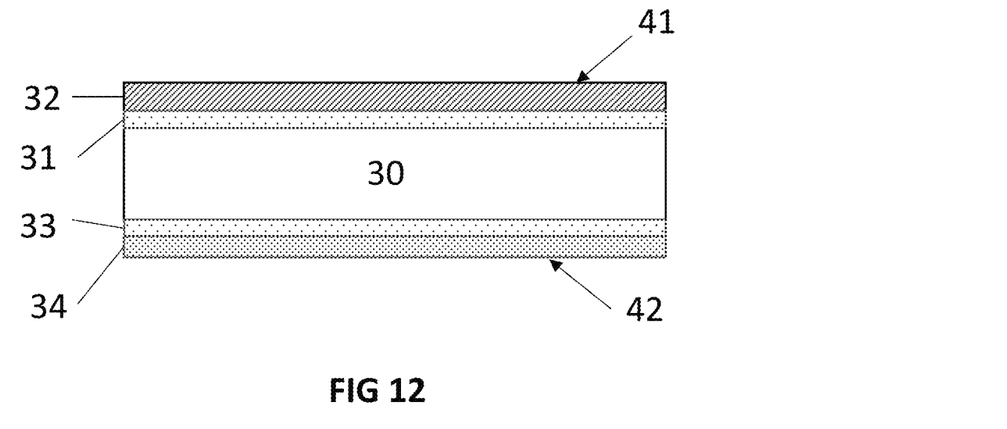

Next, as illustrated in FIG. 12 and FIG. 10 step 304, a first intrinsic a-Si:H passivation layer 33 is deposited on the rear surface 42 of the substrate 30, followed by deposition of a first doped a-Si:H layer 34 (in the example described here: a $p^+$ doped a-Si:H layer) on the first intrinsic a-Si:H layer 33. Deposition of the amorphous silicon layers may comprise deposition by means of PECVD, for example at a temperature in the range between 150° C. and 200° C. at a pressure of 2.0 mbar (200 Pa) to 2.5 mbar (250 Pa). Examples of precursors that may be used are $SiH_4$ (e.g. 100 sccm to 200 sccm) and $H_2$ (e.g. 500 sccm to 1000 sccm) for the intrinsic amorphous silicon layer and in addition $B(CH_3)/H_2$ (e.g. 100 sccm to 200 sccm) for the $p^+$ doped amorphous silicon layer. In the example shown, the first ($p^+$ doped) a-Si:H layer 34 is provided for forming emitter regions of the photovoltaic cell. In other examples, instead of depositing a $p^+$ doped a-Si:H layer on the n-type crystalline silicon substrate 30, an $n^+$ doped a-Si:H layer may be deposited for forming back surface field regions of the photovoltaic cell. The thickness of the first intrinsic a-Si:H layer 33 may be in the range between 3 nm and 10 nm. The thickness of the second (e.g. $p^+$ doped) a-Si:H layer 34 may be in the range between 5 nm and 35 nm.

Figure 13:
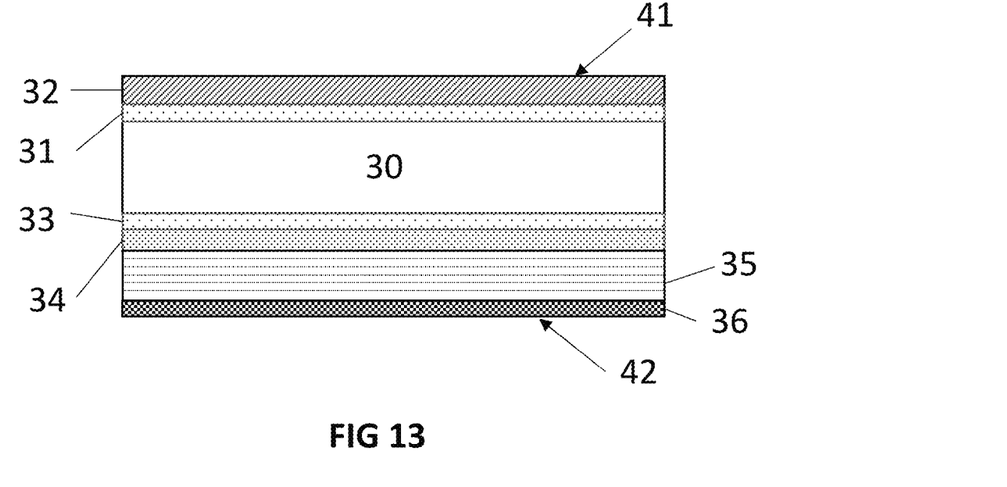

The first i-a-Si:H layer 33 and the first doped $p^+$-a-Si:H layer 34 are then patterned in accordance with the first aspect of the disclosed technology, as schematically illustrated in FIG. 10, steps 305 to 309 and further in FIG. 13 to FIG. 16. At step 305 a distributed Bragg reflector 35, such as a dielectric distributed Bragg reflector comprising alternating silicon oxide and silicon nitride layers, is deposited (FIG. 10, step 305) on the first doped a-Si:H layer 34. On top of the distributed Bragg reflector 35 an absorbing layer 36, such as an a-Si:H layer, is deposited (FIG. 10, step 306) in accordance with the disclosed technology. This is illustrated in FIG. 13.

Figure 14:
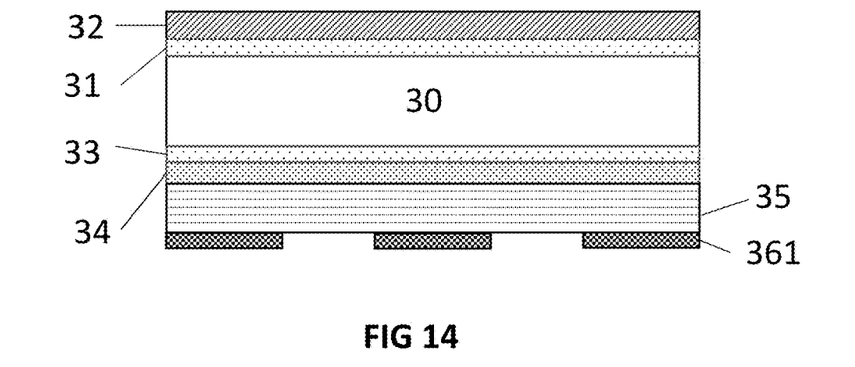

At step 307 (FIG. 10) the absorbing layer 36 is patterned by laser ablation to define emitter regions (in accordance with a predetermined pattern) of the photovoltaic cell in the example shown, thereby also defining back surface regions (being the regions complementary to the emitter regions). In the example shown, the laser ablation process removes the absorbing layer 36 at locations where no emitter region is to be formed, i.e. at locations corresponding to back surface regions of the photovoltaic cell. FIG. 14 is a schematic cross section of the structure after absorbing layer patterning, showing a patterned absorbing layer 361.

Figure 15:
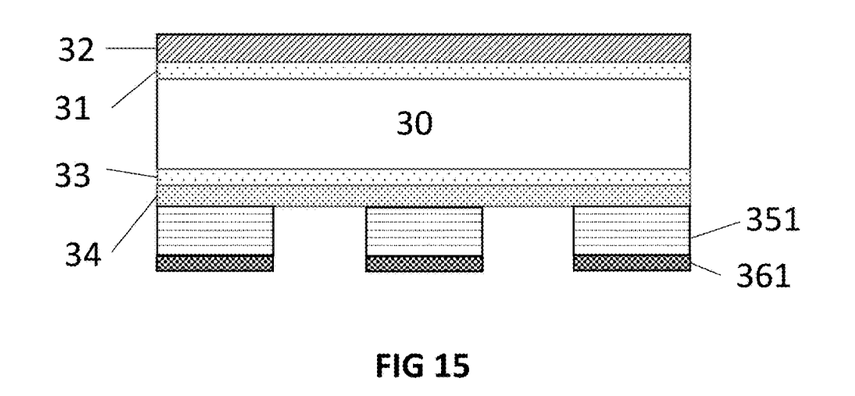

After laser ablation of the absorbing layer 36, the distributed Bragg reflector 35 is patterned by etching (FIG. 10 step 308), using the patterned absorbing layer 361 as an etch mask. As an etchant for the distributed Bragg reflector 35, a $HF:HCl:H_2O$ 1:1:20 solution may be used. A cross section of the resulting structure is schematically shown in FIG. 15, illustrating the patterned distributed Bragg reflector 351.

Figure 16:
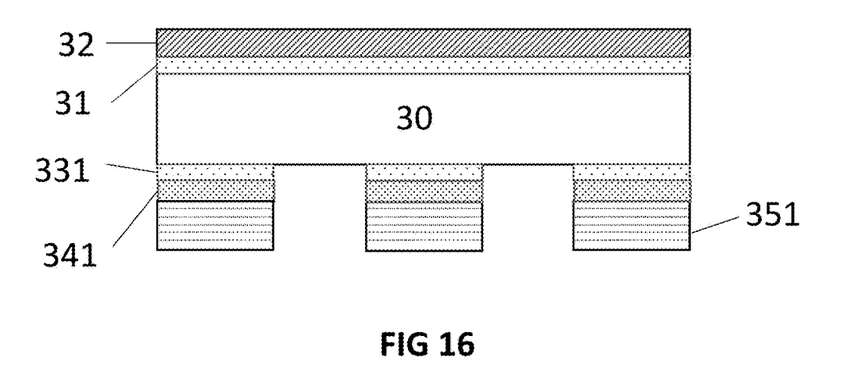

Using the patterned distributed Bragg reflector 351 as an etching mask, the underlying amorphous silicon layers (first doped a-Si:H layer 34 and first i-a-Si:H layer 33) are etched (FIG. 10, step 309), thereby patterning the amorphous silicon layers according to the predetermined pattern and forming patterned amorphous silicon layers 341, 331 (FIG. 16). Etching of the amorphous silicon layers may comprise dry etching, such as $NF_3$/Ar plasma etching. In the example shown, in the photovoltaic cell the first patterned doped a-Si:H layer 341 ($p^+$-a-Si:H) forms emitter regions and the underlying first patterned i-a-Si:H layer 331 provides surface passivation of the emitter regions. In the example described here, wherein the absorbing layer is an amorphous silicon layer, the step of etching the first doped a-Si:H layer 34 and the first i-a-Si:H layer 33 also removes the absorbing layer (FIG. 16).

Figure 17:
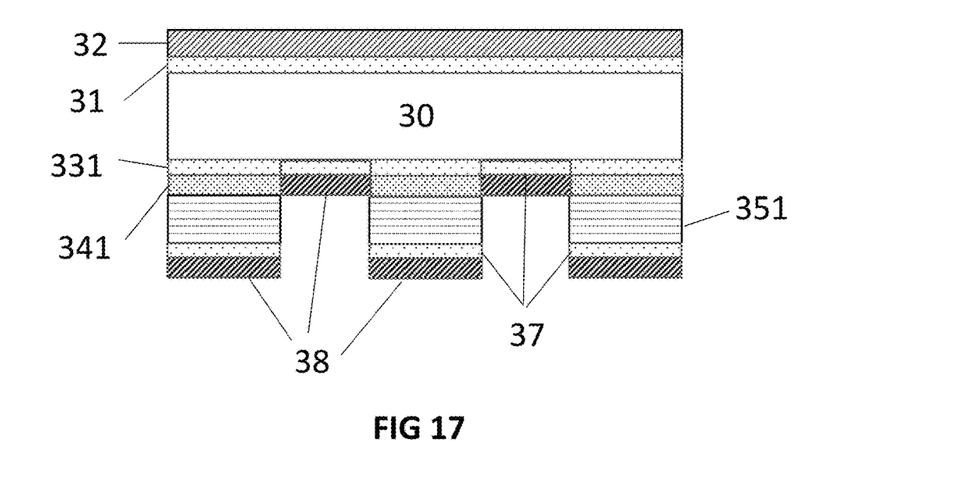

Then (FIG. 17), with the patterned distributed Bragg reflector 351 still present at the rear side, a second intrinsic a-Si:H passivation layer 37 is deposited at the rear side, followed by deposition of a second doped a-Si:H layer 38 (FIG. 10, step 310). In the example described here, the second doped a-Si:H layer 38 is an $n^+$ doped a-Si:H layer. The second amorphous silicon layers 37, 38, are thereby provided at locations on the rear surface of the silicon substrate 30 where first amorphous silicon layers 33 and 34 have been removed, and also on the patterned distributed Bragg reflector 351. In the example shown, the $n^+$ doped a-Si:H layer 38 is provided for forming back surface field regions of the photovoltaic cell, at locations complementary to the emitter regions. A cross section of the resulting structure is schematically shown in FIG. 17.

Figure 18:
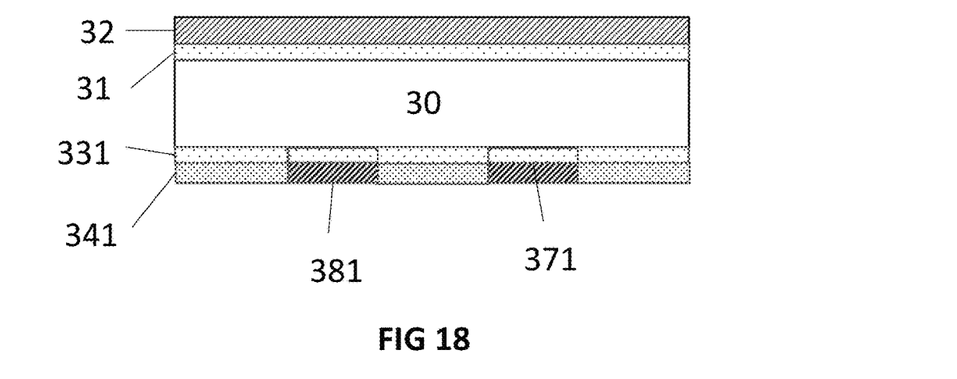

In a further process step 311 the patterned distributed Bragg reflector 351 is removed by wet etching, for example using a $HF:HCl:H_2O$ 1:1:20 etching solution, thereby also removing the parts of the second intrinsic a-Si:H passivation layer 37 and of the second doped ($n^+$-doped in this example) a-Si:H layer 38 that were deposited on the patterned distributed Bragg reflector. Thereby a second patterned intrinsic a-Si:H passivation layer 371 and a second patterned doped ($n^+$-doped in this example) a-Si:H layer 381 are formed at the rear side of the substrate 30. In the example shown, in the photovoltaic cell the second patterned doped $n^+$-a-Si:H layer 381 forms back surface field regions and the underlying second patterned i-a-Si:H layer 371 provides surface passivation of the back surface field regions. This results in a structure comprising a silicon substrate 30 with a pattern of emitter regions (first patterned i-a-Si:H layer 331 and first patterned $p^+$-a-Si:H layer 341) and a complementary pattern of back surface field regions (second patterned i-a-Si:H layer 371 and second 341 patterned $n^+$-a-Si:H layer 381) (FIG. 18). By using the above described method, the back surface field regions are self-aligned with the emitter regions.

Figure 19:
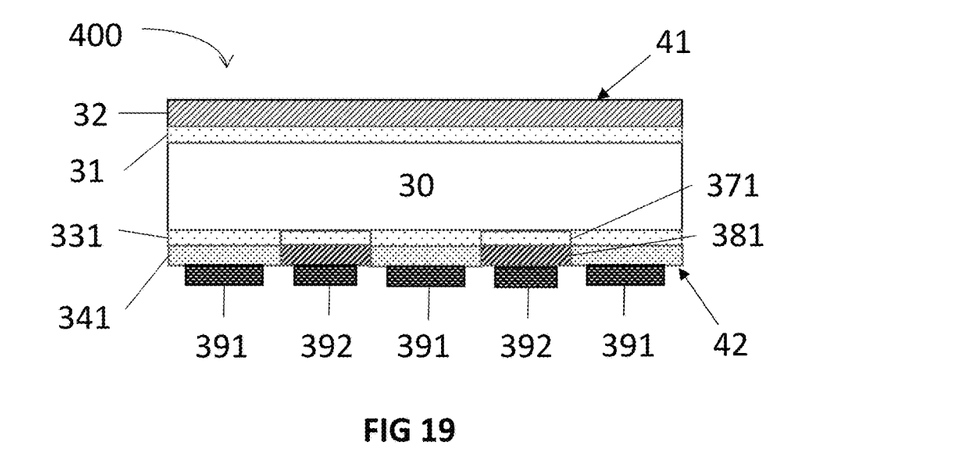

Step 312 (FIG. 10) comprises deposition of a contact material layer or layer stack and patterning of the contact material layer or layer stack, thereby forming emitter contacts 391 and back surface field contacts 392 of the photovoltaic cell (FIG. 19). A layer stack comprising a 80 nm to 120 nm thick Indium-doped Tin Oxide (ITO) layer and a 0.5 micrometer to 3 micrometer thick Cu layer may be deposited, e.g., by sputtering, at the rear side of the substrate. Other materials, such as Al, may be used for forming the contact material. The contact material layer or layer stack may be patterned by photolithography. Also direct patterning techniques such as inkjet printing or screen printing may be used for providing the contact material.

The foregoing description details certain embodiments of the disclosure. It will be appreciated, however, that no matter how detailed the foregoing appears in text, the disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

It is to be understood that although preferred embodiments, specific constructions and configurations, as well as materials, have been discussed herein for methods and devices according to the disclosed technology, various changes or modifications in form and detail may be made without departing from the scope of this invention.

Whereas the above detailed description as well as the summary of the disclosure has been focused on a method for fabricating a device, the disclosed technology also relates to a device comprising patterned layers obtained using a method according to any of the embodiments as described above.

What is claimed is:

1. A method of patterning an amorphous semiconductor layer according to a predetermined pattern via laser ablation with a pulsed laser having a laser wavelength, the method comprising:
providing the amorphous semiconductor layer on a substrate;
providing a distributed Bragg reflector on the amorphous semiconductor layer, wherein the distributed Bragg reflector is reflective at the laser wavelength;
providing an absorbing layer on the distributed Bragg reflector, wherein the absorbing layer is absorptive at the laser wavelength;
patterning the absorbing layer by laser ablation with the pulsed laser, in accordance with the predetermined pattern, thereby obtaining a patterned absorbing layer;
patterning the distributed Bragg reflector by performing an etching step using the patterned absorbing layer as an etch mask, thereby obtaining a patterned distributed Bragg reflector; and
etching the amorphous semiconductor layer using the patterned distributed Bragg reflector as an etch mask, thereby patterning the amorphous semiconductor layer according to the predetermined pattern.

2. The method according to claim 1, further comprising removing the patterned distributed Bragg reflector.

3. A method of fabricating a silicon heterojunction back contact photovoltaic cell, the method comprising:
depositing on a rear surface of a doped crystalline silicon substrate a first doped amorphous silicon layer of a first doping type;
patterning the first doped amorphous silicon layer according to a predetermined pattern using the method according to claim 2,
wherein the first doped amorphous silicon layer is the same layer as the amorphous silicon layer provided on the substrate.

4. The method of fabricating a silicon heterojunction back contact photovoltaic cell according to claim 3, further comprising:
after the step of patterning the first doped amorphous silicon layer, depositing a second doped amorphous silicon layer at the rear surface of the crystalline silicon substrate, the second doped amorphous silicon layer having a second doping type opposite to the first doping type.

5. The method of fabricating a silicon heterojunction back contact photovoltaic cell according to claim 4, wherein depositing the second doped amorphous silicon layer is done before removing the patterned distributed Bragg reflector.

6. The method of fabricating a silicon heterojunction back contact photovoltaic cell according to claim 3, wherein the first doped amorphous silicon layer has a first doping type opposite to a doping type of the crystalline silicon substrate and wherein the predetermined pattern of the first patterned doped amorphous silicon layer corresponds to an emitter pattern of the back contact heterojunction silicon photovoltaic cell.

7. The method according to claim 2, wherein the distributed Bragg reflector has a reflectance higher than about 80% at the laser wavelength.

8. The method according to claim 7, wherein the absorbing layer has an absorptance higher than about 90% at the laser wavelength.

9. The method according to claim 1, wherein the distributed Bragg reflector has a reflectance higher than about 70% at the laser wavelength.

10. The method according to claim 1, wherein the absorbing layer has an absorptance higher than about 90% at the laser wavelength.

11. The method according to claim 1, wherein the distributed Bragg reflector comprises a stack of alternating dielectric layers.

12. The method according to claim 1, wherein the distributed Bragg reflector comprises a stack of alternating dielectric layers, the stack comprising at least one sub-stack consisting of a silicon oxide layer and a silicon nitride layer.

13. The method according to claim 1, wherein the distributed Bragg reflector comprises a stack of alternating dielectric layers, the stack comprising 1 to 10 sub-stacks, each sub-stack consisting of a silicon oxide layer and a silicon nitride layer.

14. The method according to claim 1, wherein the distributed Bragg reflector comprises a stack of alternating semiconductor layers.

15. The method according to claim 1, wherein the absorbing layer is an amorphous silicon layer.

16. The method according to claim 1, wherein the amorphous semiconductor layer comprises an amorphous silicon layer.

17. A method of fabricating a silicon heterojunction back contact photovoltaic cell, the method comprising:
depositing on a rear surface of a doped crystalline silicon substrate a first doped amorphous silicon layer of a first doping type;

patterning the first doped amorphous silicon layer according to a predetermined pattern using the method according to claim 1.

18. The method of fabricating a silicon heterojunction back contact photovoltaic cell according to claim 17, further comprising:

after the step of patterning the first doped amorphous silicon layer, depositing a second doped amorphous silicon layer at the rear surface of the crystalline silicon substrate, the second doped amorphous silicon layer having a second doping type opposite to the first doping type.

19. The method of fabricating a silicon heterojunction back contact photovoltaic cell according to claim 17, wherein the first doped amorphous silicon layer has a first doping type opposite to a doping type of the crystalline silicon substrate and wherein the predetermined pattern of the first patterned doped amorphous silicon layer corresponds to an emitter pattern of the back contact heterojunction silicon photovoltaic cell.

20. The method according to claim 1, wherein the distributed Bragg reflector has a reflectance higher than about 80% at the laser wavelength.

* * * * *